United States Patent
Hogyoku (10) Patent No.: US 6,787,851 B2
(45) Date of Patent: Sep. 7, 2004

(54) SEMICONDUCTOR DEVICES INCLUDING A SILICON-ON-INSULATOR LAYER

(75) Inventor: Michiru Hogyoku, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/025,347

(22) Filed: Dec. 19, 2001

(65) Prior Publication Data

US 2002/0109192 A1 Aug. 15, 2002

(30) Foreign Application Priority Data

Dec. 19, 2000 (JP) ........................................ 2000-385530

(51) Int. Cl.[7] .......................... H01L 27/01; H01L 27/12; H01L 31/0392
(52) U.S. Cl. ........................ 257/347; 257/348; 257/349; 257/350; 257/351; 257/352; 257/353; 257/354
(58) Field of Search ................................. 257/347–354

(56) References Cited

U.S. PATENT DOCUMENTS

| | | | | | |
|---|---|---|---|---|---|
| 5,315,144 | A | * | 5/1994 | Cherne ........................ | 257/351 |
| 5,410,172 | A | * | 4/1995 | Koizumi et al. ............ | 257/347 |
| 5,488,243 | A | * | 1/1996 | Tsuruta et al. .............. | 257/314 |
| 5,614,433 | A | * | 3/1997 | Mandelman ................ | 438/154 |
| 5,780,899 | A | * | 7/1998 | Hu et al. ..................... | 257/335 |
| 6,060,749 | A | * | 5/2000 | Wu .............................. | 257/347 |
| 6,096,583 | A | * | 8/2000 | Iwamatsu et al. ........... | 438/149 |
| 6,300,172 | B1 | * | 10/2001 | Ang et al. ................... | 438/149 |
| 6,339,244 | B1 | * | 1/2002 | Krivokapic ................. | 257/349 |
| 6,353,245 | B1 | * | 3/2002 | Unnikrishnan .............. | 257/336 |
| 6,358,783 | B1 | * | 3/2002 | Yamaguchi et al. ........ | 438/163 |
| 2001/0029067 | A1 | * | 10/2001 | Hirano ........................ | 438/142 |
| 2001/0045602 | A1 | * | 11/2001 | Maeda et al. ............... | 257/347 |
| 2002/0022366 | A1 | * | 2/2002 | Cabral et al. ............... | 438/682 |

OTHER PUBLICATIONS

Wei and Antoniadis, "Minimizing Floating–Body–Induced Threshold Voltage Variation in Partialy Depleted SOI CMOS," *IEEE Electron Devices Letters*, vol. 17, No. 8 (Aug. 1996) at pp. 391–394.

* cited by examiner

*Primary Examiner*—Amir Zarabian
*Assistant Examiner*—Ida M. Soward
(74) *Attorney, Agent, or Firm*—Konrad Raynes & Victor, LLP; Alan S. Raynes

(57) ABSTRACT

A semiconductor device in accordance with one example of the present invention pertains to a semiconductor device to be used for a CMOS inverter circuit, comprising a BOX layer 2 formed on a silicon substrate 1, a SOI film 3 including single crystal Si formed on the BOX layer, a gate oxide film 4 formed on the SOI film 3, a gate electrode 5 formed on the gate oxide film, and diffusion layers 7, 8 for source/drain regions formed in source/drain regions of the SOI film 3, wherein, when a power supply voltage of 0.6 V is used, a thickness $T_{SOI}$ of the SOI film 3 is 0.084 μm or greater and 0.094 μm or smaller, and an impurity concentration of the SOI film is $7.95 \times 10^{17}/cm^3$ or greater and $8.05 \times 10^{17}/cm^3$ or smaller.

18 Claims, 7 Drawing Sheets

SEMICONDUCTOR DEVICES INCLUDING A SILICON-ON-INSULATOR LAYER

Applicant hereby incorporates by reference Japanese Application No. 2000-385530, filed Dec. 19, 2000, in its entirety.

1. Technical Field

The present invention relates to semiconductor devices and may include semiconductor devices that are applied to a CMOS inverter circuit using a partially depleted SOI— CMOSFET with a floating body.

2. Related Art

A conventional semiconductor device is described below.

A CMOS inverter circuit using a partially depleted SOI (silicon on insulator)—CMOSFET in certain forms may be considered as a conventional semiconductor device. However, this CMOS inverter circuit in conventional form has a problem of duty cycle dependency of input signals which results from substrate floating effects, which is observed as an inverter delay time.

The following three semiconductor devices can be considered as means which may solve the above described problem.

As a first semiconductor device, a fully depleted SOI— MOSFET that does not show the substrate floating effect may be used. Also, as a second semiconductor device, a semiconductor device, in which a body is provided with a terminal and its potential is fixed at a source potential to restrict the substrate floating effect, in other word, a body-tied-to-source operation is conducted, may be used. Also, as a third semiconductor device, a semiconductor device, in which a body is provided with a terminal and its potential is fixed at a gate potential to restrict the substrate floating effect, in other word, a body-tied-to-gate operation is conducted, may be used.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Problems with the three semiconductor devices described above in the related art section include the following. When the first semiconductor device is used, the SOI layer needs to be made extremely thin in order to restrict the short-channel effect (resulting in a lowered threshold voltage and an increased sub-threshold coefficient). It is very difficult to control the reduction of the film thickness of such a SOI layer, the controllability in the electric characteristics deteriorates in association with such an extreme reduction of the film thickness of the SOI layer, and the contact resistance of the source/drain regions increases. Therefore, the use of the first semiconductor device is not generally desired.

Also, when the second semiconductor device is used, a terminal needs to be provided on the body, which results in a problem in that the area per element increases. Therefore, the use of the second semiconductor device is also not generally desired.

Further, when the third semiconductor device is used, not only does the area per element increase, but also the gate capacity increases. Therefore, the use of the third semiconductor device is also not generally desired.

In view of all the above, a partially depleted SOI— CMOSFET with a floating body may be used to seek a solution to solve the problem of duty cycle dependency of input signals which results from substrate floating effects, which is observed as an inverter delay time.

Preferred embodiments of the present invention has been made in view of the circumstances described above. It is an object of certain embodiments to provide a semiconductor device that solves the problem of the duty cycle dependency.

To solve the problems described above, embodiments of the present invention relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 0.6 V is used, a thickness of the SOI film is 0.084 $\mu$m or greater and 0.094 $\mu$m or smaller, and an impurity concentration of the SOI film is 7.95×10$^{17}$/cm$^3$ or greater and 8.05×10$^{17}$/cm$^3$ or smaller.

By the semiconductor device described above, the film thickness of the SOI film, the impurity concentration of the SOI film, and the power supply voltage are adjusted such that the total amounts of the body majority carriers under steady state in both of the bias conditions in an OUT-HIGH (IN-LOW) state and an OUT-LOW (IN-HIGH) state become generally equal to each other. By this control, the problem of duty cycle dependency of input signals, which is observed as an inverter delay time is solved. This is discussed in detail in a document entitled "Minimizing Floating Body-Induced Threshold Voltage Variation in Partially Depleted SOI CMOS" in IEEE Electron Device Lett., vol. 17, p. 391, Aug. 1996, by A Wei et al.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 0.6 V is used, a thickness of the SOI film is 0.089 µm or greater and 0.099 µm or smaller, and an impurity concentration of the SOI film is $8.95\times10^{17}/cm^3$ or greater and $9.05\times10^{17}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 0.6 V is used, a thickness of the SOI film is 0.093 µm or greater and 0.103 µm or smaller, and an impurity concentration of the SOI film is $0.095\times10^{18}/cm^3$ or greater and $1.005\times10^{18}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 0.6 V is used, a thickness of the SOI film is 0.096 µm or greater and 0.106 µm or smaller, and an impurity concentration of the SOI film is $1.095\times10^{18}/cm^3$ or greater and $1.105\times10^{18}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 0.6 V is used, a thickness of the SOI film is 0.100 µm or greater and 0.110 µm or smaller, and an impurity concentration of the SOI film is $1.195\times10^{18}/cm^3$ or greater and $1.205\times10^{18}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 0.8 V is used, a thickness of the SOI film is 0.068 µm or greater and 0.078 µm or smaller, and an impurity concentration of the SOI film is $7.95\times10^{17}/cm^3$ or greater and $8.05\times10^{17}/cm^3$ or smaller.

A semiconductor device in accordance with the present invention pertains to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 0.8 V is used, a thickness of the SOI film is 0.074 µm or greater and 0.084 µm or smaller, and an impurity concentration of the SOI film is $8.95\times10^{17}/cm^3$ or greater and $9.05\times10^{17}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 0.8 V is used, a thickness of the SOI film is 0.078 µm or greater and 0.088 µm or smaller, and an impurity concentration of the SOI film is $0.095\times10^{18}/cm^3$ or greater and $1.005\times10^{18}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 0.8 V is used, a thickness of the SOI film is 0.083 µm or greater and 0.093 µm or smaller, and an impurity concentration of the SOI film is $1.095\times10^{18}/cm^3$ or greater and $1.105\times10^{18}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 0.8 V is used, a thickness of the SOI film is 0.087 µm or greater and 0.097 µm or smaller, and an impurity concentration of the SOI film is $1.195\times10^{18}/cm^3$ or greater and $1.205\times10^{18}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 1.0 V is used, a thickness of the SOI film is 0.057 µm or greater and 0.067 µm or smaller, and an impurity concentration of the SOI film is $7.95\times10^{17}/cm^3$ or greater and $8.05\times10^{17}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 1.0 V is used, a thickness of the SOI film is 0.063 µm or greater and 0.073 µm or smaller, and an impurity concentration of the SOI film is $8.95\times10^{17}/cm^3$ or greater and $9.05\times10^{17}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 1.0 V is used, a thickness of the SOI film is 0.068 µm or greater and 0.078 µm or smaller, and an impurity concentration of the SOI film is $0.095 \times 10^{18}/cm^3$ or greater and $1.005 \times 10^{18}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 1.0 V is used, a thickness of the SOI film is 0.072 µm or greater and 0.082 µm or smaller, and an impurity concentration of the SOI film is $1.095 \times 10^{18}/cm^3$ or greater and $1.105 \times 10^{18}/cm^3$ or smaller.

Embodiments also relate to a semiconductor device to be used for a CMOS inverter circuit, the semiconductor device comprising: a dielectric film formed on a semiconductor substrate; a SOI film composed of single crystal Si formed on the dielectric layer film; a gate dielectric film formed on the SOI film; a gate electrode formed on the gate dielectric film; and a diffusion layer for source/drain regions formed in source/drain regions of the SOI film, wherein, when a power supply voltage of 1.0 V is used, a thickness of the SOI film is 0.076 µm or greater and 0.086 µm or smaller, and an impurity concentration of the SOI film is $1.195 \times 10^{18}/cm^3$ or greater and $1.205 \times 10^{18}/cm^3$ or smaller.

Certain preferred embodiments of the present invention are described below with reference to the accompanying drawings.

Figure 1:
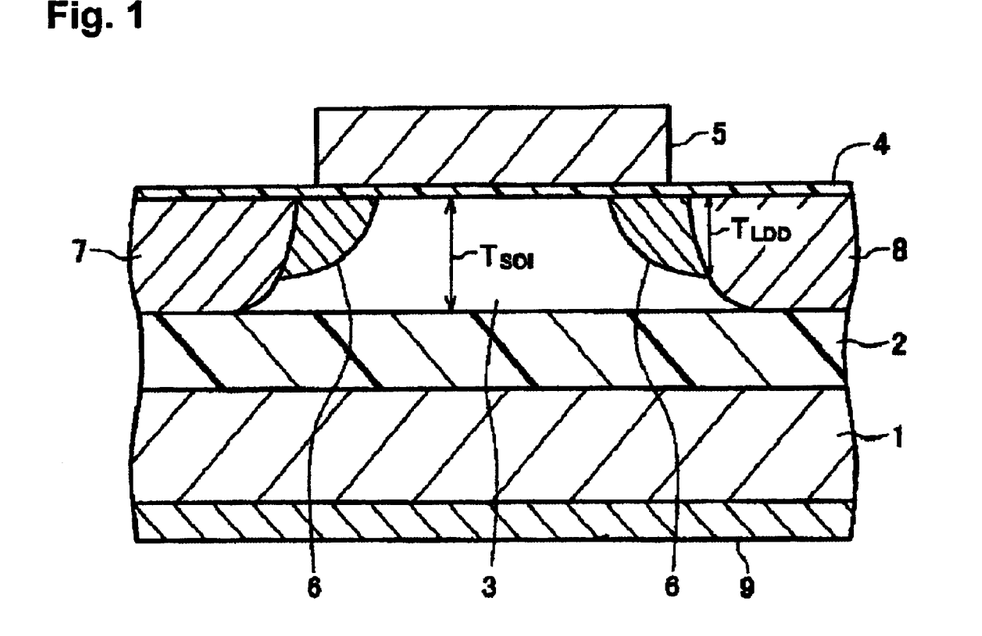
FIG. 1 shows a cross-sectional view of a semiconductor device in accordance with one embodiment of the present invention.

FIG. 1 shows a cross-sectional view of a semiconductor device in accordance with one embodiment of the present invention. The semiconductor device is a partially depleted SOI—CMOFET that is used for a CMOS inverter circuit.

The semiconductor device has a silicon substrate 1, and a BOX layer (dielectric film) 2 formed on the silicon substrate 1. A SOI film (body) 3 that is preferably composed of single crystal Si having a thickness of $T_{SOI}$ is formed on the BOX layer 2. A gate oxide layer 4 is formed on the SOI film 3, and a gate electrode 5 is formed on the gate oxide layer 4. In the SOI film 3, a low concentration impurity diffusion layer 6 is formed in a LDD (lightly doped drain) region, and diffusion layers 7 and 8 for source/drain regions are formed in source/drain regions. Also, a back gate electrode 9 is formed below the silicon substrate 1.

By using the partially depleted SOI—CMOFET described above, a method is adopted to solve the problem of duty cycle dependency of input signals which results from the substrate floating effect, which is observed as an inverter delay time. According to the method, the film thickness of the SOI film, the impurity concentration distribution of the SOI film (body), and the power supply voltage Vdd are adjusted such that the total amounts of the body majority carriers under steady state in both of the bias conditions in an OUT-HIGH (IN-LOW) state and an OUT-LOW (IN-HIGH) state become generally equal to each other. By this control, the problem of duty cycle dependency of input signals, which is observed as an inverter delay time, is solved. This is discussed in detail in a document entitled "Minimizing Floating Body-Induced Threshold Voltage Variation in Partially Depleted SOI CMOS" in IEEE Electron Device Lett., vol. 17, p. 391, Aug. 1996, by A Wei et al.

Next, specific examples of how the film thickness of the SOI film, the impurity concentration distribution of the SOI film (body), and the power supply voltage Vdd are adjusted are described.

Simulations to optimize the thickness of a SOI film can be performed by a two-dimensional device analysis in connection with the duty cycle dependency of input signals, which is observed as an inverter delay time.

Structural parameters of partially depleted SOI—MOSFETs that re used in the two-dimensional analysis are as follows.

Gate length: 0.18 µm

Gate sidewall width: 0.07 µm

Impurity diffusion length of source/drain/LDD: 0.04 µm

Thickness $T_{SOI}$ of SOI: 0.06 µm, 0.065 µm, 0.07 µm, 0.075 µm, 0.08 µm, 0.085 µm, 0.09 µm, 0.095 µm, 0.1 µm, 0.105 µm, 0.11 µm, 0.115 µm, or 0.12 µm Thickness of gate oxide film: 0.004 µm Thickness of BOX layer (Embedded oxide film): 0.4 µm Thickness of silicon substrate: 0.4 µm Junction depth $T_{LDD}$ of LDD: 0.07 µm Impurity concentration of the body (assuming it spatially uniformly distributes): $8 \times 10^{17}/cm^3$, $9 \times 10^{17}/cm^3$, $1 \times 10^{18}/cm^3$, $1.1 \times 10^{18}/cm^3$, $1.2 \times 10^{18}/cm^3$ Maximum value of impurity concentration of source/drain regions: $5 \times 10^{20}/cm^3$ Maximum value of impurity concentration of LDD: $1 \times 10^{19}/cm^3$ Impurity concentration of silicon substrate: $5 \times 10^{14}/cm^3$ Three power supply voltages Vdd at 0.6 V, 0.8 V and 1.0 V are assumed. The work function of the gate electrode is 4.17 V, assuming the case of $n^+$ polysilicon.

The analysis is performed by relying on a drift—diffusion model which is represented by a sum of a drift term that proportions the flow of carriers to an electric filed and a diffusion term that proportions the same to a concentration gradient. Both carriers of electrons and holes are expressly treated, and SRH (Shockley Read Hall) recombination that is dependent on the impurity concentration and band-gap narrowing effects are considered, along with Auger recombination. As a parameter for SRH recombination, a default value: $\tau n = \tau p = 0.1$ µsec is used. The concentration of carriers is evaluated by Boltzmann statistic. It is assumed that the entire impurity is ionized. It is noted that the impact ionization and inter-band tunneling are not considered as low power supply voltages are assumed. Also, the carrier energy balance equation or the lattice thermal flow equation is not considered.

Next, results of the two-dimensional device analysis are described.

The total amounts of body majority carriers in both OUT-HIGH and OUT-LOW device conditions under steady state are calculated. It is noted that the device analysis is conducted in two-dimensional, such that the total amount of body majority carriers is standardized with the channel width: w (the unit is 1/m).

Figure 2:
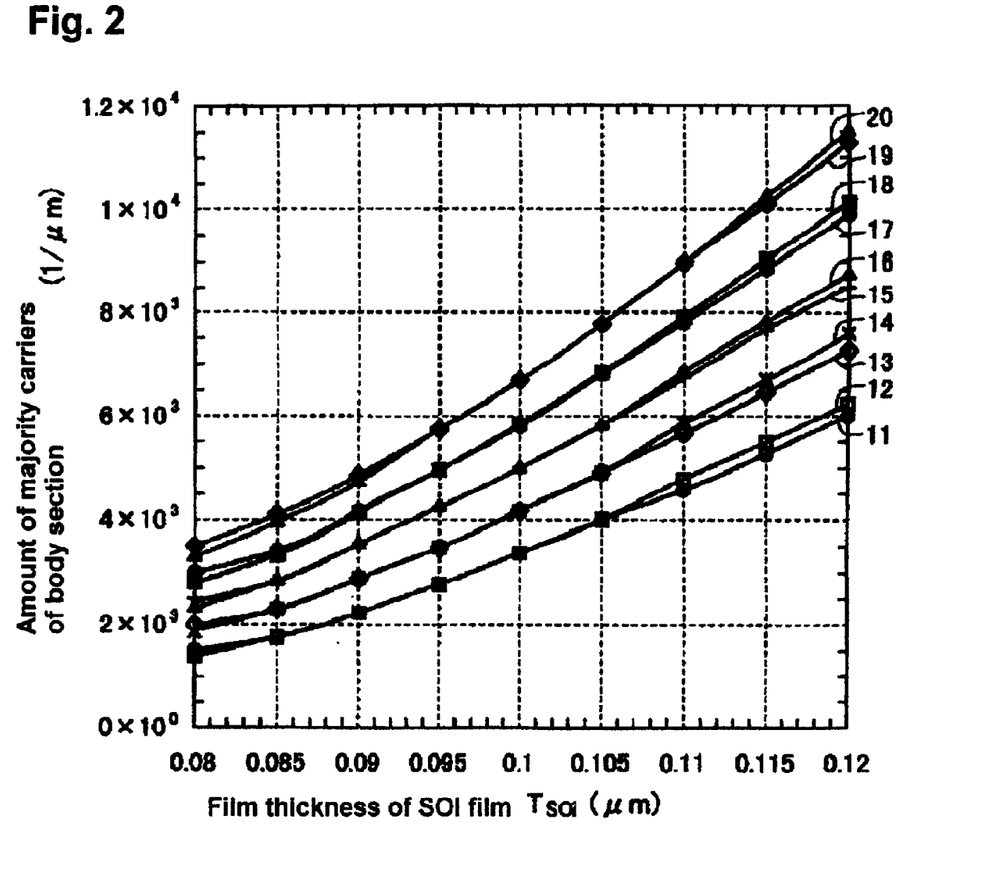
FIG. 2 shows a graph illustrating relations between the film thickness $T_{SOI}$ of the SOI film and the amount of majority carriers in the body section in OUT-HIGH state and OUT-LOW state when the power supply voltage is set at 0.6 V and the impurity concentration of the body is changed.

FIG. 2 shows a graph illustrating relations between the film thickness $T_{SOI}$ of the SOI film and the amount of majority carriers in the body section in the OUT-HIGH state and the OUT-LOW state when the power supply voltage is set at 0.6 V and the impurity concentration of the body is changed.

Reference number 11 pertains to the OUT-HIGH state with the impurity concentration of the body being $8\times10^{17}/cm^3$. Reference number 12 pertains to the OUT-LOW state with the impurity concentration of the body being $8\times10^{17}/cm^3$. Reference number 13 pertains to the OUT-HIGH state with the impurity concentration of the body being $9\times10^{17}/cm^3$. Reference number 14 pertains to the OUT-LOW state with the impurity concentration of the body being $9\times10^{17}/cm^3$. Reference number 15 pertains to the OUT-HIGH state with the impurity concentration of the body being $1\times10^{18}/cm^3$. Reference number 16 pertains to the OUT-LOW state with the impurity concentration of the body being $1\times10^{18}/cm^3$. Reference number 17 pertains to the OUT-HIGH state with the impurity concentration of the body being $1.1\times10^{18}/cm^3$. Reference number 18 pertains to the OUT-LOW state with the impurity concentration of the body being $1.1\times10^{18}/cm^3$. Reference number 19 pertains to the OUT-HIGH state with the impurity concentration of the body being $1.2\times10^{18}/cm^3$. Reference number 20 pertains to the OUT-LOW state with the impurity concentration of the body being $1.2\times10^{18}/cm^3$.

Figure 3:
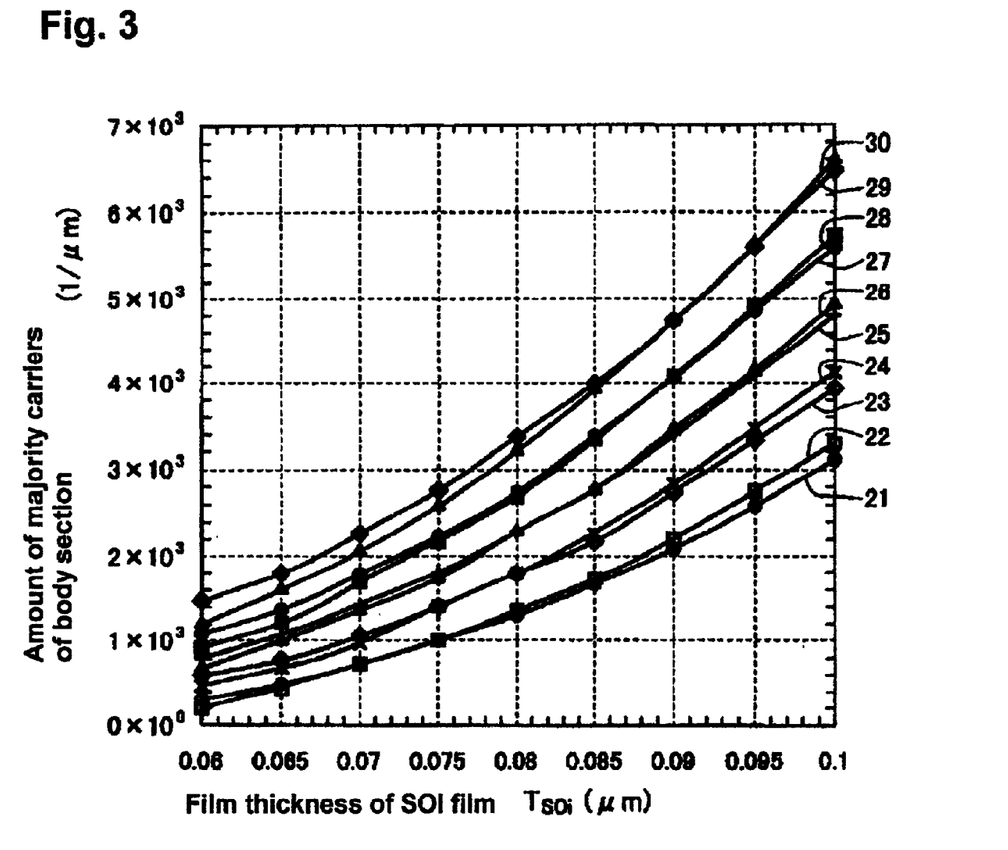
FIG. 3 shows a graph illustrating relations between the film thickness $T_{SOI}$ of the SOI film and the amount of majority carriers in the body section in OUT-HIGH state and OUT-LOW state when the power supply voltage is set at 0.8 V and the impurity concentration of the body is changed.

FIG. 3 shows a graph illustrating relations between the film thickness $T_{SOI}$ of the SOI film and the amount of majority carriers in the body section in the OUT-HIGH state and the OUT-LOW state when the power supply voltage is set at 0.8 V and the impurity concentration of the body is changed.

Reference number 21 pertains to the OUT-HIGH state with the impurity concentration of the body being $8\times10^{17}/cm^3$. Reference number 22 pertains to the OUT-LOW state with the impurity concentration of the body being $8\times10^{17}/cm^3$. Reference number 23 pertains to the OUT-HIGH state with the impurity concentration of the body being $9\times10^{17}/cm^3$. Reference number 24 pertains to the OUT-LOW state with the impurity concentration of the body being $9\times10^{17}/cm^3$. Reference number 25 pertains to the OUT-HIGH state with the impurity concentration of the body being $1\times10^{18}/cm^3$. Reference number 26 pertains to the OUT-LOW state with the impurity concentration of the body being $1\times10^{18}/cm^3$. Reference number 27 pertains to the OUT-HIGH state with the impurity concentration of the body being $1.1\times10^{18}/cm^3$. Reference number 28 pertains to the OUT-LOW state with the impurity concentration of the body being $1.1\times10^{18}/cm^3$. Reference number 29 pertains to the OUT-HIGH state with the impurity concentration of the body being $1.2\times10^{18}/cm^3$. Reference number 30 pertains to the OUT-LOW state with the impurity concentration of the body being $1.2\times10^{18}/cm^3$.

Figure 4:
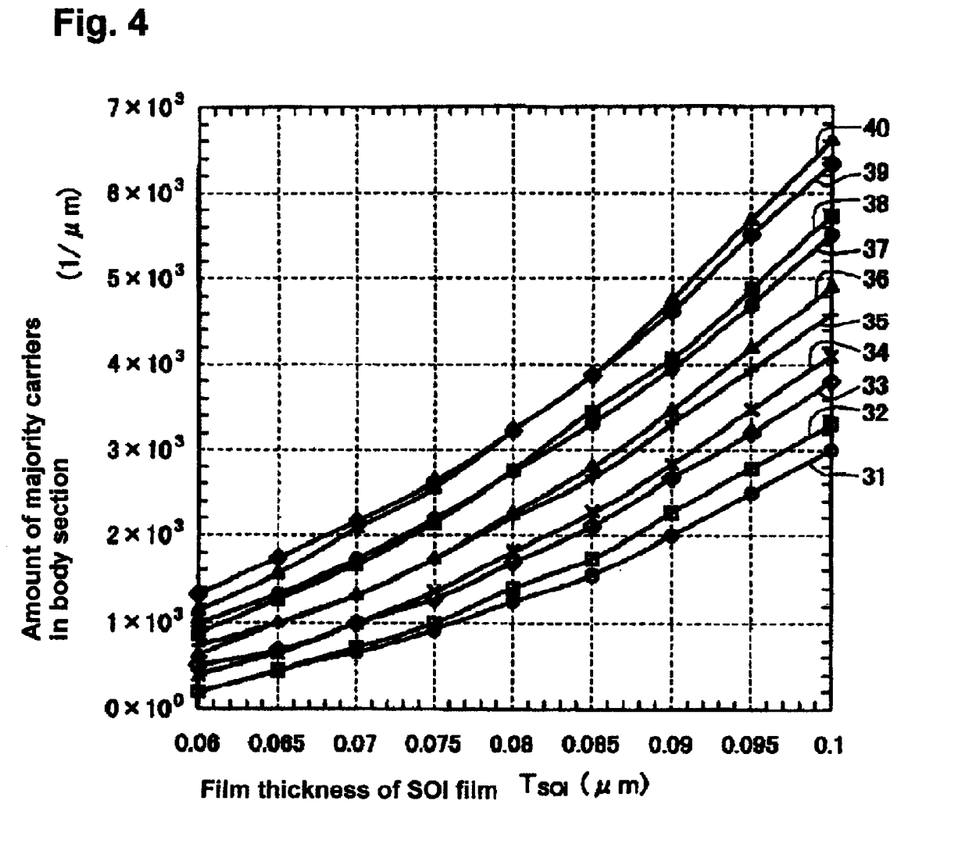
FIG. 4 shows a graph illustrating relations between the film thickness $T_{SOI}$ of the SOI film and the amount of majority carriers in the body section in OUT-HIGH state and OUT-LOW state when the power supply voltage is set at 1.0 V and the impurity concentration of the body is changed.

FIG. 4 shows a graph illustrating relations between the film thickness $T_{SOI}$ of the SOI film and the amount of majority carriers in the body section in the OUT-HIGH state and the OUT-LOW state when the power supply voltage is set at 1.0 V and the impurity concentration of the body is changed.

Reference number 31 pertains to the OUT-HIGH state with the impurity concentration of the body being $8\times10^{17}/cm^3$. Reference number 32 pertains to the OUT-LOW state with the impurity concentration of the body being $8\times10^{17}/cm^3$. Reference number 33 pertains to the OUT-HIGH state with the impurity concentration of the body being $9\times10^{17}/cm^3$. Reference number 34 pertains to the OUT-LOW state with the impurity concentration of the body being $9\times10^{17}/cm^3$. Reference number 35 pertains to the OUT-HIGH state with the impurity concentration of the body being $1\times10^{18}/cm^3$. Reference number 36 pertains to the OUT-LOW state with the impurity concentration of the body being $1\times10^{18}/cm^3$. Reference number 37 pertains to the OUT-HIGH state with the impurity concentration of the body being $1.1\times10^{18}/cm^3$. Reference number 38 pertains to the OUT-LOW state with the impurity concentration of the body being $1.1\times10^{18}/cm^3$. Reference number 39 pertains to the OUT-HIGH state with the impurity concentration of the body being $1.2\times10^{18}/cm^3$. Reference number 40 pertains to the OUT-LOW state with the impurity concentration of the body being $1.2\times10^{18}/cm^3$.

Referring to FIGS. 2–4, a point at which curves in the OUT-HIGH state and the OUT-LOW state at the same impurity concentration in the body section overlap one another is where the amounts of majority carriers become equal to one another, and represents an optimum film thickness of the SOI film that can avoid the problem of duty cycle dependency of input signals which is observed as an inverter delay time. Relations between the film thickness and impurity concentrations are shown in FIG. 5.

Figure 5:
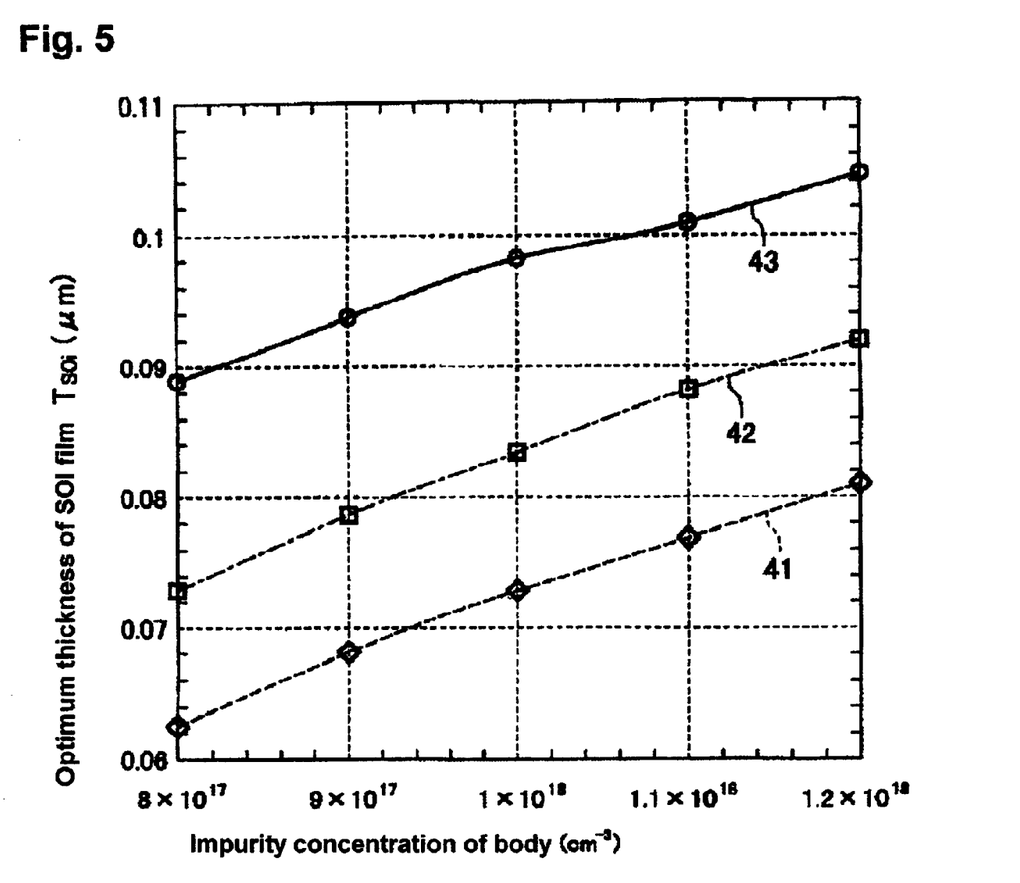
FIG. 5 is a graph showing optimum values of the thickness of the SOI film with respect to a variety of impurity concentrations of the body and power supply voltages, which are obtained by conducting a leaner interpolation of the results shown in FIGS. 2–4.

FIG. 5 is a graph showing optimum values of the thickness of the SOI film with respect to a variety of impurity concentrations of the body and power supply voltages, which are obtained by conducting a leaner interpolation of the results shown in FIGS. 2–4.

Reference number 41 indicates the relation between impurity concentrations of the body and optimum film thickness of the SOI film when the power supply voltage is 1.0 V. Reference number 42 indicates the relation between impurity concentrations of the body and optimum film thickness of the SOI film when the power supply voltage is 0.8 V. Reference number 43 indicates the relation between impurity concentrations of the body and optimum film thickness of the SOI film when the power supply voltage is 0.6 V.

Next, transient transfer characteristics with the steady states under OUT-HIGH and OUT-LOW bias conditions as being initial device internal states are analyzed, to thereby calculate transient threshold voltages. It is noted that an example in which the power supply voltage is 0.8 V is employed.

Figure 6:
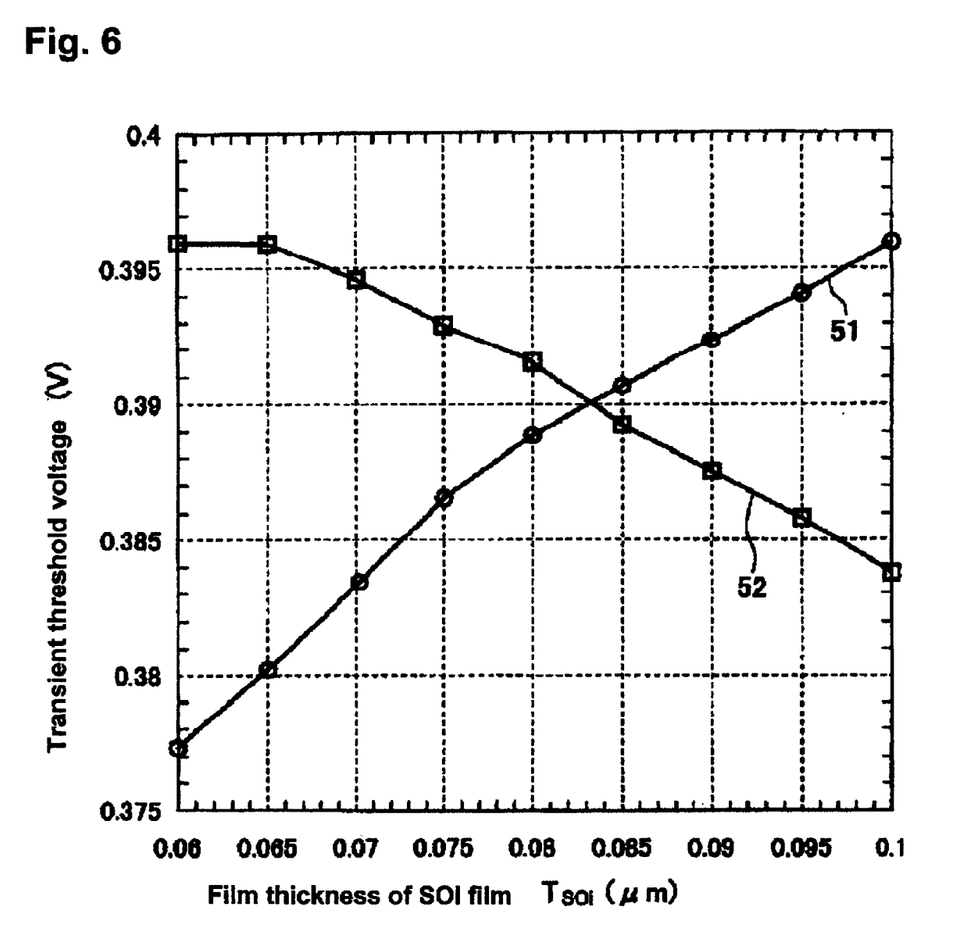
FIG. 6 is a graph showing relations between the film thickness of the SOI film and transient threshold voltages. Reference number 51 indicates the case in OUT-HIGH state, and reference number 52 indicates the case in OUT-LOW state.

FIG. 6 is a graph showing relations between the film thickness of the SOI film and transient threshold voltages when the impurity concentration of the body is $1\times10^{18}/cm^{-3}$. Reference number 51 indicates the case in OUT-HIGH state, and reference number 52 indicates the ease in OUT-LOW state.

According to the graph, a point where both of the lines cross one another is where the threshold values as being the electrical characteristics concur with one another, and this point indicates an optimum value. Also, in one embodiment, when a margin of ±0.5% is given for the transient threshold voltage at the optimum thickness of the SOI film, it is understood that variations in the thickness of the SOI film of about ±0.005 μm may be permitted.

Figure 7:
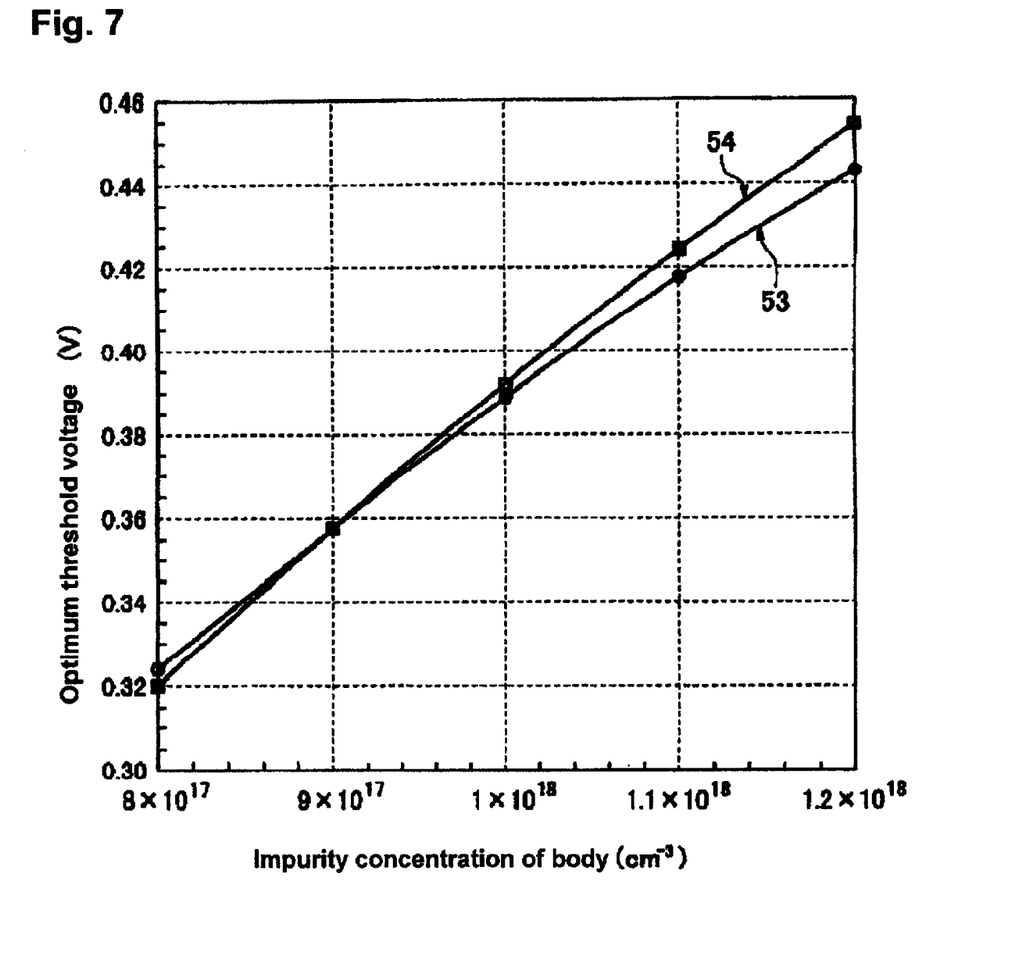
FIG. 7 is a graph showing relations between the impurity concentration of the body and transient threshold voltages. Reference number 53 indicates the case in OUT-HIGH state, and reference number 54 indicates the case in OUT-LOW state.

Also, FIG. 7 is a graph showing relations between the impurity concentration of the body and transient threshold voltages when the film thickness of the SOI film is 0.08 μm. Reference number 53 indicates the case in OUT-HIGH state, and reference number 54 indicates the case in OUT-LOW state.

According to the graph, a point where both of the lines cross one another is where the threshold values as being the electrical characteristics concur with one another, and this point indicates an optimum value. Also, in one embodiment, when a margin of ±0.5% is given for the transient threshold voltage at the optimum impurity concentration of the body, it is understood that variations in the impurity concentration of the body of about $\pm 0.05\times10^{17}$ ($=\pm 0.005\times10^{18}$)/$cm^3$ may be permitted.

In view of the above, in the semiconductor device shown in FIG. 1, the optimum thickness of the SOI film, the impurity concentration of the body (SOI film) and the power supply voltage Vdd which can solve the problem of duty cycle dependency of input signals, which is observed as an inverter delay time, are as follows.

When a power supply voltage of 0.6 V is used, the SOI film may preferably have a thickness of 0.089±0.005 μm, and the SOI film may preferably have an impurity concentration of $(8\pm0.05)\times10^{17}/cm^3$. Also, the SOI film may preferably have a thickness of 0.094±0.005 μm, and the SOI film may preferably have an impurity concentration of $(9\pm0.05)\times10^{17}/cm^3$. Also, the SOI film may preferably have a thickness of 0.098±0.005 μm, and the SOI film may preferably have an impurity concentration of $(1\pm0.005)\times10^{18}/cm^3$. Also, the SOI film may preferably have a thickness of 0.101±0.005 μm, and the SOI film may preferably have an impurity concentration of $(1.1\pm0.005)\times10^{18}/cm^3$. Also, the SOI film may preferably have a thickness of 0.105±0.005 μm, and the SOI film may preferably have an impurity concentration of $(1.2\pm0.005)\times10^{18}/cm^3$.

When a power supply voltage of 0.8 V is used, the SOI film may preferably have a thickness of 0.073±0.005 μm, and the SOI film may preferably have an impurity concentration of $(8\pm0.05)\times10^{17}/cm^3$. Also, the SOI film may preferably have a thickness of 0.079±0.005 μm, and the SOI film may preferably have an impurity concentration of $(9\pm0.05)\times10^{17}/cm^3$. Also, the SOI film may preferably have a thickness of 0.083±0.005 μm, and the SOI film may preferably have an impurity concentration of $(1\pm0.005)\times10^{18}/cm^3$. Also, the SOI film may preferably have a thickness of 0.088±0.005 μm, and the SOI film may preferably have an impurity concentration of $(1.1\pm0.005)\times10^{18}/cm^3$. Also, the SOI film may preferably have a thickness of 0.092±0.005 μm, and the SOI film may preferably have an impurity concentration of $(1.2\pm0.005)\times10^{18}/cm^3$.

When a power supply voltage of 1.0 V is used, the SOI film may preferably have a thickness of 0.062±0.005 μm, and the SOI film may preferably have an impurity concentration of $(8\pm0.05)\times10^{17}/cm^3$. Also, the SOI film may preferably have a thickness of 0.068±0.005 μm, and the SOI film may preferably have an impurity concentration of $(9\pm0.05)\times10^{17}/cm^3$. Also, the SOI film may preferably have a thickness of 0.073±0.005 μm, and the SOI film may preferably have an impurity concentration of $(1\pm0.005)\times10^{18}/cm^3$. Also, the SOI film may preferably have a thickness of 0.077±0.005 μm, and the SOI film may preferably have an impurity concentration of $(1.1\pm0.005)\times10^{18}/cm^3$. Also, the SOI film may preferably have a thickness of 0.081±0.005 μm, and the SOI film may preferably have an impurity concentration of $(1.2\pm0.005)\times10^{18}/cm^3$.

In accordance with the embodiments described above, technical resources for controlling the short-channel effect more than those required for bulk CMOSFETs are not required, a controllability of the electric characteristic can be obtained at a similar level obtained by bulk CMOSFETs, the area per element and the gate capacity do not increase, and the problem of duty cycle dependency of input signals which characteristically occurs in body floating controlled partially depleted SOI—CMOSFETs can be avoided.

It is noted that the present invention is not limited to the embodiments described above, and many modifications can be made.

As described above, in accordance with certain embodiments of the present invention, the film thickness of a SOI film, the impurity concentration of the SOI film, and the power supply voltage are adjusted such that the total amounts of the body majority carriers under steady state in both of the bias conditions in an OUT-HIGH (IN-LOW) state and an OUT-LOW (IN-HIGH) state become generally equal to each other. By this control, the problem of duty cycle dependency of input signals, which is observed as an inverter delay time, may be solved.

What is claimed:

1. A semiconductor device to be used for a CMOS inverter circuit, the semiconductor device comprising:
   a dielectric film formed on a semiconductor substrate;
   a SOI film comprising single crystal Si formed on the dielectric layer film;
   a gate dielectric film formed on the SOI film;
   a gate electrode formed on the gate dielectric film; and
   a diffusion layer for source/drain regions formed in source/drain regions of the SOI film,
   wherein, when a power supply voltage of 0.6 V is used,
   a thickness of the SOI film is 0.084 μm or greater and 0.094 μm or smaller, and an impurity concentration of the SOI film is $7.95\times10^{17}/cm^3$ or greater and $8.05\times10^{17}/cm^3$ or smaller.

2. A semiconductor device to be used for a CMOS inverter circuit, the semiconductor device comprising:
   a dielectric film formed on a semiconductor substrate;
   a SOI film comprising single crystal Si formed on the dielectric layer film;
   a gate dielectric film formed on the SOI film;
   a gate electrode formed on the gate dielectric film; and
   a diffusion layer for source/drain regions formed in source/drain regions of the SOI film,
   wherein, when a power supply voltage of 0.6 V is used,
   a thickness of the SOI film is 0.089 μm or greater and 0.099 μm or smaller, and an impurity concentration of the SOI film is $8.95\times10^{17}/cm^3$ or greater and $9.05\times10^{17}/cm^3$ or smaller.

3. A semiconductor device to be used for a CMOS inverter circuit, the semiconductor device comprising:
   a dielectric film formed on a semiconductor substrate;
   a SOI film comprising single crystal Si formed on the dielectric layer film;
   a gate dielectric film formed on the SOI film;
   a gate electrode formed on the gate dielectric film; and
   a diffusion layer for source/drain regions formed in source/drain regions of the SOI film,
   wherein, when a power supply voltage of 0.6 V is used,
   a thickness of the SOI film is 0.093 μm or greater and 0.103 μM or smaller, and an impurity concentration of the SOI film is $0.095\times10^{18}/cm^3$ or greater and $1.005\times10^{18}/cm^3$ or smaller.

4. A semiconductor device to be used for a CMOS inverter circuit, the semiconductor device comprising:
   a dielectric film formed on a semiconductor substrate;
   a SOI film comprising single crystal Si formed on the dielectric layer film;
   a gate dielectric film formed on the SOI film;
   a gate electrode formed on the gate dielectric film; and
   a diffusion layer for source/drain regions formed in source/drain regions of the SOI film,
   wherein, when a power supply voltage of 0.6 V is used,
   a thickness of the SOI film is, 0.096 μm or greater and 0.106 μm or smaller, and an impurity concentration of the SOI film is $1.095\times10^{18}/cm^3$ or greater and $1.105\times10^{18}/cm^3$ or smaller.

5. A semiconductor device to be used for a CMOS inverter circuit, the semiconductor device comprising:
    a dielectric film formed on a semiconductor substrate;
    a SOI film comprising single crystal Si formed on the dielectric layer film;
    a gate dielectric film formed on the SOI film;
    a gate electrode formed on the gate dielectric film; and
    a diffusion layer for source/drain regions formed in source/drain regions of the SOI film,
    wherein, when a power supply voltage of 0.6 V is used,
    a thickness of the SOI film is 0.100 µm or greater and 0.110 m or smaller, and an impurity concentration of the SOI film is $1.195 \times 10^{18}/cm^3$ or greater and $1.205 \times 10^{18}/cm^3$ or smaller.

6. A semiconductor device to be used for a CMOS inverter circuit, the semiconductor device comprising:
    a dielectric film formed on a semiconductor substrate;
    a SOI film comprising single crystal Si formed on the dielectric layer film;
    a gate dielectric film formed on the SOI film;
    a gate electrode formed on the gate dielectric film; and
    a diffusion layer for source/drain regions formed in source/drain regions of the SOI film,
    wherein, when a power supply voltage of 0.8 V is used,
    a thickness of th SOI film is 0.068 µm or greater and 0.078 µm or smaller, and an impurity concentration of the SOI film is $7.95 \times 10^{17}/cm^3$ or greater and $8.05 \times 10^{17}/cm^3$ or smaller.

7. A semiconductor device to be used for a CMOS inverter circuit, the semiconductor device comprising:
    a dielectric film formed on a semiconductor substrate;
    a SOI film comprising single crystal Si formed on the dielectric layer film;
    a gate dielectric film formed on the SOI film;
    a gate electrode formed on the gate dielectric film; and
    a diffusion layer for source/drain regions formed in source/drain regions of the SOI film,
    wherein, when a power supply voltage of 0.8 V is used,
    a thickness of the SOI film is 0.074 µm or greater and 0.084 µm or smaller, and an impurity concentration of the SOI film is $8.95 \times 10^{17}/cm^3$ or greater and $9.05 \times 10^{17}/cm^3$ or smaller.

8. A semiconductor device to be used for a CMOS inverter circuit, the semiconductor device comprising:
    a dielectric film formed on a semiconductor substrate;
    a SOI film comprising single crystal Si formed on the dielectric layer film;
    a gate dielectric film formed on the SOI film;
    a gate electrode formed on the gate dielectric film; and
    a diffusion layer for source/drain regions formed in source/drain regions of the SOI film,
    wherein, when a power supply voltage of 0.8 V is used,
    a thickness of the SOI film is 0.078 µm or greater and 0.088 µm or smaller, and an impurity concentration of the SOI film is $0.095 \times 10^{18}/cm^3$ or greater and $1.005 \times 10^{18}/cm^3$ or smaller.

9. A semiconductor device to be used for a CMOS inverter circuit, the semiconductor device comprising:
    a dielectric film formed on a semiconductor substrate;
    a SOI film comprising single crystal Si formed on the dielectric layer film;
    a gate dielectric film formed on the SOI film;
    a gate electrode formed on the gate dielectric film; and
    a diffusion layer for source/drain regions formed in source/drain regions of the SOI film,
    wherein, when a power supply voltage of 0.8 V is used,
    a thickness of the SOI film is 0.083 µm or greater and 0.093 µm or smaller, and an impurity concentration of the SOI film is $1.095 \times 10^{18}/cm^3$ or greater and $1.105 \times 10^{18}/cm^3$ or smaller.

10. A semiconductor device to be used for a CMOS inverter circuit, the semiconductor device comprising:
    a dielectric film formed on a semiconductor substrate;
    a SOI film comprising single crystal Si formed on the dielectric layer film;
    a gate dielectric film formed on the SOI film;
    a gate electrode formed on the gate dielectric film; and
    a diffusion layer for source/drain regions formed in source/drain regions of the SOI film,
    wherein, when a power supply voltage of 0.8 V is used,
    a thickness of the SOI film is 0.087 µm or greater and 0.097 µm or smaller, and an impurity concentration of the SOI film is $1.195 \times 10^{18}/cm^3$ or greater and $1.205 \times 10^{18}/cm^3$ or smaller.

11. A semiconductor device to be used for a CMOS inverter circuit, the semiconductor device comprising:
    a dielectric film formed on a semiconductor substrate;
    a SOI film comprising single crystal Si formed on the dielectric layer film;
    a gate dielectric film formed on the SOI film;
    a gate electrode formed on the gate dielectric film; and
    a diffusion layer for source/drain regions formed in source/drain regions of the SOI film,
    wherein, when a power supply voltage of 1.0 V is used,
    a thickness of the SOI film is 0.057 µm or greater and 0.067 µm or smaller, and an impurity concentration of the SOI film is $7.95 \times 10^{17}/cm^3$ or greater and $8.05 \times 10^{17}/cm^3$ or smaller.

12. A semiconductor device to be used for a CMOS inverter circuit, the semiconductor device comprising:
    a dielectric film formed on a semiconductor substrate;
    a SOI film comprising single crystal Si formed on the dielectric layer film;
    a gate dielectric film formed on the SOI film;
    a gate electrode formed on the gate dielectric film; and
    a diffusion layer for source/drain regions formed in source/drain regions of the SOI film,
    wherein, when a power supply voltage of 1.0 V is used,
    a thickness of the SOI film is 0.063 µm or greater and 0.073 µm or smaller, and an impurity concentration of the SOI film is $8.95 \times 10^{17}/cm^3$ or greater and $9.05 \times 10^{17}/cm^3$ or smaller.

13. A semiconductor device to be used for a CMOS inverter circuit, the semiconductor device comprising:
    a dielectric film formed on a semiconductor substrate;
    a SOI film comprising single crystal Si formed on the dielectric layer film;
    a gate dielectric film formed on the SOI film;

a gate electrode formed on the gate dielectric film; and a diffusion layer for source/drain regions formed in source/drain regions of the SOI film, wherein, when a power supply voltage of 1.0 V is used, a thickness of the SOI film is 0.068 $\mu$m or greater and 0.078 $\mu$m or smaller, and an impurity concentration of the SOI film is $0.095 \times 10^{18}/cm^3$ or greater and $1.005 \times 10^{18}/cm^3$ or smaller.

14. A semiconductor device to be used for a CMOS inverter circuit, the semiconductor device comprising:

a dielectric film formed on a semiconductor substrate;

a SOI film comprising single crystal Si formed on the dielectric layer film;

a gate dielectric film formed on the SOI film;

a gate electrode formed on the gate dielectric film; and a diffusion layer for source/drain regions formed in source/drain regions of the SOI film, wherein, when a power supply voltage of 1.0 V is used, a thickness of the SOI film is 0.072 $\mu$m or greater and 0.082 $\mu$m or smaller, and an impurity concentration of the SOI film is $1.095 \times 10^{18}/cm^3$ or greater and $1.005 \times 10^{18}/cm^3$ or smaller.

15. A semiconductor device to be used for a CMOS inverter circuit, the semiconductor device comprising:

a dielectric film formed on a semiconductor substrate;

a SOI film comprising single crystal Si formed on the dielectric layer film;

a gate dielectric film formed on the SOI film;

a gate electrode formed on the gate dielectric film; and a diffusion layer for source/drain regions formed in source/drain regions of the SOI film, wherein, when a power supply voltage of 1.0 V is used, a thickness of the SOI film is 0.076 $\mu$m or greater and 0.086 $\mu$m or smaller, and an impurity concentration of the SOI film is $1.195 \times 10^{18}/cm^3$ or greater and $1.205 \times 10^{18}/cm^3$ or smaller.

16. A semiconductor device as in claim 1, further comprising first and second low concentration diffusion regions in contact with source/drain regions, the first and second low concentration diffusion regions having a lower impurity concentration than the source/drain regions, the first and second low concentration diffusion regions being separated from each other by a portion of the SOI film under the gate dielectric film, wherein a portion of each of the low concentration diffusion regions extends under the gate electrode.

17. A semiconductor device as in claim 6, further comprising first and second low concentration diffusion regions in contact with source/drain regions, the first and second low concentration diffusion regions having a lower impurity concentration than the source/drain regions, the first and second low concentration diffusion regions being separated from each other by a portion of the SOI film under the gate dielectric film, wherein a portion of each of the low concentration diffusion regions extends under the gate electrode.

18. A semiconductor device as in claim 11, further comprising first and second low concentration diffusion regions in contact with source/drain regions, the first and second low concentration diffusion regions having a lower impurity concentration than the source/drain regions, the first and second low concentration diffusion regions being separated from each other by a portion of the SOI film under the gate dielectric film, wherein a portion of each of the low concentration diffusion regions extends under the gate electrode.

* * * * *